(12) United States Patent
Jung

(10) Patent No.: US 9,583,825 B2
(45) Date of Patent: Feb. 28, 2017

(54) ANTENNA DEVICE AND ELECTRONIC DEVICE WITH THE SAME

(71) Applicant: Samsung Electronics Co., Ltd., Gyeonggi-do (KR)

(72) Inventor: Young-Hwan Jung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 147 days.

(21) Appl. No.: 14/445,762

(22) Filed: Jul. 29, 2014

(65) Prior Publication Data

US 2015/0042528 A1 Feb. 12, 2015

(30) Foreign Application Priority Data

Aug. 6, 2013 (KR) .................. 10-2013-0093151

(51) Int. Cl.
| | |
|---|---|
| H01Q 1/00 | (2006.01) |
| H01Q 1/52 | (2006.01) |
| H01Q 1/24 | (2006.01) |
| H01Q 1/44 | (2006.01) |
| H01Q 9/04 | (2006.01) |
| H01Q 7/00 | (2006.01) |

(52) U.S. Cl.
CPC ............ *H01Q 1/523* (2013.01); *H01Q 1/243* (2013.01); *H01Q 1/44* (2013.01); *H01Q 9/0407* (2013.01); *H01Q 7/00* (2013.01)

(58) Field of Classification Search
CPC ....... H01Q 9/0407; H01Q 1/243; H01Q 1/526
USPC .................................................. 343/787, 841
See application file for complete search history.

(56) References Cited

U.S. PATENT DOCUMENTS

| | | | | |
|---|---|---|---|---|
| 6,867,746 | B2* | 3/2005 | Mendolia ............... | H01Q 1/243 343/700 MS |
| 7,079,079 | B2* | 7/2006 | Jo ........................ | H01Q 1/243 343/700 MS |
| 7,764,236 | B2* | 7/2010 | Hill ....................... | H01Q 1/243 343/702 |
| 8,570,838 | B2* | 10/2013 | Fujisawa ............... | G04C 10/02 343/718 |
| 2007/0057851 | A1* | 3/2007 | Leizerovich .......... | H01Q 1/44 343/702 |
| 2010/0026590 | A1 | 2/2010 | Chiang et al. | |
| 2011/0068178 | A1* | 3/2011 | Gebhart .......... | G06K 19/07749 235/492 |
| 2012/0062439 | A1* | 3/2012 | Liao .................... | H01L 23/481 343/841 |
| 2013/0038278 | A1 | 2/2013 | Park et al. | |
| 2015/0303561 | A1* | 10/2015 | Yang ................... | H01Q 1/2266 343/842 |

* cited by examiner

*Primary Examiner* — Dameon E Levi
*Assistant Examiner* — Hasan Islam
(74) *Attorney, Agent, or Firm* — The Farrell Law Firm, P.C.

(57) ABSTRACT

An electronic device is provided. The electronic device includes a printed circuit board (PCB), a shield can disposed on the PCB, an antenna radiator of which at least a part enters an internal space of the shield can and is installed at an inner surface of the shield can, and an electrical connecting means which is installed at a corresponding position of the PCB so as to be electrically connected with the at least a part of the antenna radiator installed at the inner surface of the shield can.

16 Claims, 9 Drawing Sheets

ANTENNA DEVICE AND ELECTRONIC DEVICE WITH THE SAME

PRIORITY

This application claims priority under 35 U.S.C. §119 to a Korean Patent Application filed in the Korean Intellectual Property Office on Aug. 6, 2013 and assigned Serial No. 10-2013-0093151, the entire contents of which are incorporated herein by reference.

BACKGROUND OF THE INVENTION

1. Field of the Invention

The present invention relates generally to an antenna device and an electronic device to which the antenna device is applied.

2. Description of the Related Art

Electronic devices for communication have been developed to provide various functions according to user's demands. For example, electronic devices perform a basic call function and also allow a user to listen to music using an MP3 sound source, enjoy web surfing using a wireless Internet network, download and use various programs using the wireless Internet network, and play and watch high-definition videos at high speed.

Further, electronic devices may have at least one high-pixel image pickup device (camera lens assembly) to take a picture of an object. Recently, a still-picture, moving picture, and stereoscopic image shooting capability have been provided.

Further, due to the rapid development of communication techniques, it is possible to use a communication function of Wi-Fi, GPS, Bluetooth or the like using one antenna radiator. Further, electronic devices have a Near Field Communication (NFC) function using an NFC module.

In general, since an antenna device for NFC is operated in a low frequency band (13.56 MHz), a radiator having a surface area of at least 30 mm×50 mm is required. In order to apply the radiator to electronic devices which have become gradually slimmer, various measures have been proposed.

However, in an electronic device for NFC, contacting with a feeding portion for power feeding is hindered by the external environment, and space application is also restricted. Therefore, in installing or disposing an antenna device for NFC, it is necessary to improve reliability for the antenna device.

SUMMARY OF THE INVENTION

The present invention has been made to substantially solve at least the above problems and/or disadvantages and to provide at least the advantages below. Accordingly, an aspect of the present invention is to provide an antenna device and an electronic device with the same.

Another aspect of the present invention is to provide an antenna device which is capable of reducing manufacturing cost and time, and an electronic device with the same.

Yet another aspect of the present invention is to provide an antenna device which enhances a lifespan and reliability thereof, and an electronic device with the same.

According to an aspect of the present invention, an electronic device includes a printed circuit board (PCB), a shield can disposed on the PCB, an antenna radiator of which at least a part enters an internal space of the shield can and is installed at an inner surface of the shield can, and an electrical connecting means which is installed at a corresponding position of the PCB so as to be electrically connected with the at least a part of the antenna radiator installed at the inner surface of the shield can.

According to another aspect of the present invention, a shield can includes an upper surface, a rear surface which is opposite to the upper surface, an opening which is defined in at least a portion of the upper surface to pass through to the rear surface, and an antenna radiator of which at least a part is installed at the upper surface, and a feeding portion of the antenna radiator is installed at the rear surface through the opening.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF EMBODIMENTS OF THE PRESENT INVENTION

Various embodiments of the present invention will be described herein below with reference to the accompanying drawings. In the following description, detailed descriptions of well-known functions or constructions will be omitted since they would obscure the invention in unnecessary detail. Also, the terms used herein are defined according to the functions of the present invention. Thus, the terms may vary depending on a user's or operator's intentions or practices. Therefore, the terms used herein must be understood based on the descriptions made herein.

In explaining the various embodiments of the present invention, an electronic device having a shield can which is installed on a printed circuit board (PCB), on which a plurality of electronic components is mounted, so as to shield the electronic components, and an antenna device for Near Field Communication (NFC) is illustrated and described, but the present invention is not limited thereto. For example, the electronic device may be applied to various devices having a communication function of receiving and transmitting audio, video, data or the like using a broadcasting module and a broadcasting antenna device, such as a Personal Digital Assistant (PDA), a lap-top computer, a mobile phone, a smart phone, a netbook, a Mobile Internet Device (MID), an Ultra Mobile PC (UMPC), a tablet personal PC, a navigation device, and the like.

Figure 1:
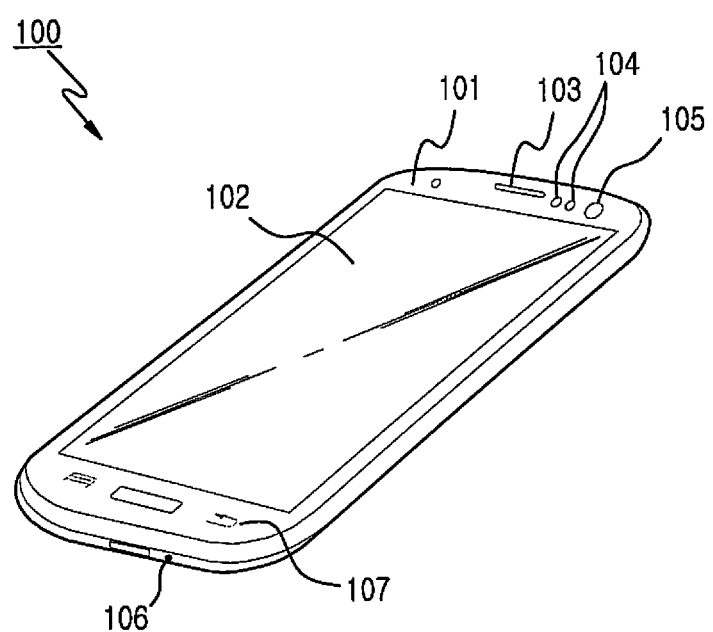
FIG. 1 is a front perspective view of an electronic device according to an embodiment of the present invention.
Figure 2:
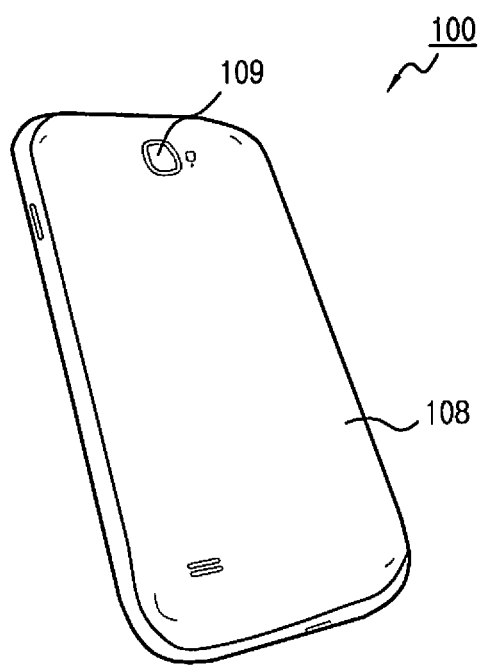
FIG. 2 is a rear perspective view of the electronic device according to an embodiment of the present invention.

FIG. 1 is a front perspective view of an electronic device 100 according to an embodiment of the present invention, and FIG. 2 is a rear perspective view of the electronic device 100 according to the embodiment of the present invention.

Referring to FIGS. 1 and 2, an electronic device 100 includes a display device 102 installed at a front surface 101 thereof. A touch screen device which simultaneously inputs and outputs data may be applied as the display device 102. An ear piece 103 receiving opponent's voice is disposed at an upper side of the display device 102, and a plurality of sensors 104, such as a proximity sensor and a illuminance sensor, and a camera device 105 may be disposed to the right side of the ear piece 103. The electronic device 100 further includes a microphone device 106 for inputting a sound, a key pad device 107 in which input buttons are disposed, and a rear camera device 109 which is installed at a rear surface 108 thereof. However, the electronic device 100 is not limited thereto, and may further include various additional devices which provide well-known additional functions.

As described below, the electronic device 100 has an embedded antenna device for wireless communication with other electronic devices. For example, the electronic device 100 may have an antenna device for NFC installed or mounted in an internal space thereof.

According to embodiments of the present invention, the antenna device for wireless communication is installed or attached to a shield can installed on a PCB. The antenna device may be a loop antenna device in which a pattern type antenna radiator is wound multiple times along an edge of a flexible printed circuit, but is not limited thereto. For example, the antenna radiator may be a plate type embedded antenna device, such as a dipole antenna device, a monopole antenna device, a helical antenna device, a micro-strip patch antenna device and a planar inverted F antenna device.

Figure 3:
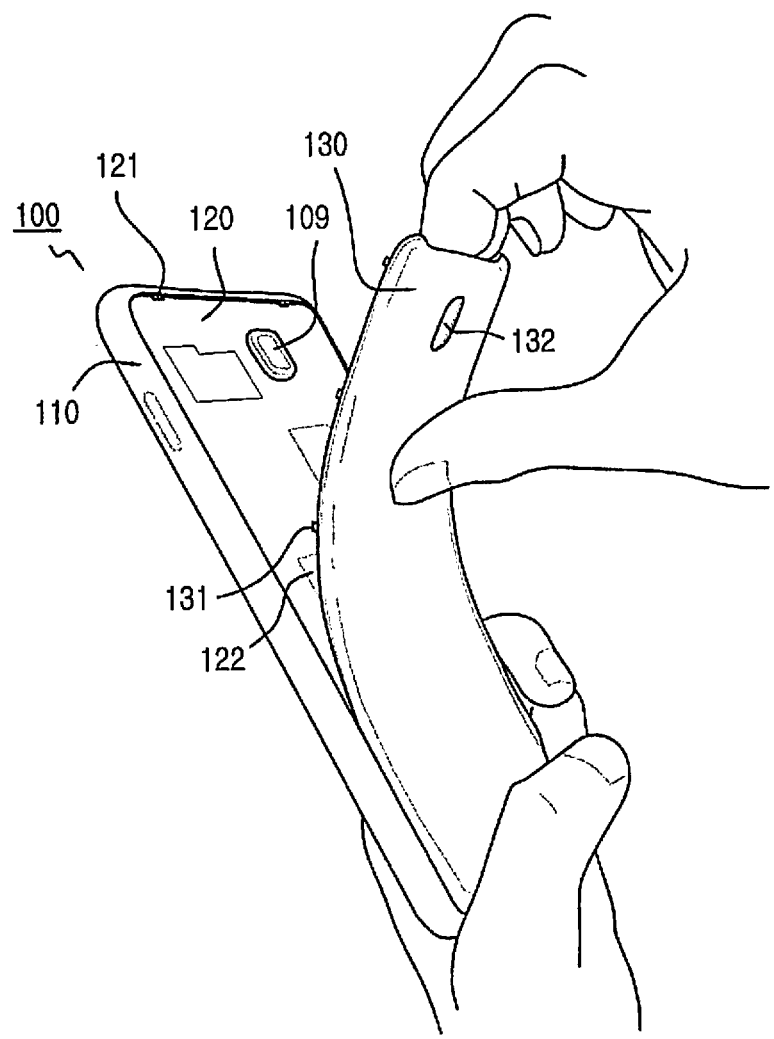
FIG. 3 is a view illustrating an installation and separation state of a rear cover of the electronic device according to an embodiment of the present invention.
Figure 4:
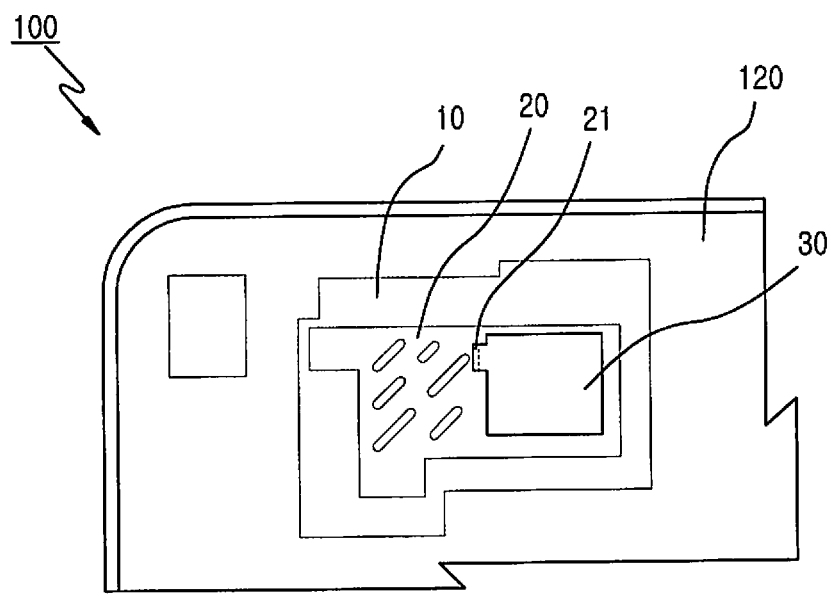
FIG. 4 illustrates an antenna device installed in the electronic device according to an embodiment of the present invention.

FIG. 3 is a view illustrating an installation and separation state of a rear cover 130 of the electronic device 100 according to an embodiment of the present invention, and FIG. 4 illustrates an antenna device 30 installed in the electronic device 100 according to an embodiment of the present invention.

Referring to FIGS. 3 and 4, the electronic device 100 includes a front housing 110, a rear housing 120 and a rear cover (or a battery cover) 130. The front housing 110 defines an external appearance of the electronic device 100, and also is coupled with the rear housing 120 and thus defines a space receiving a plurality of electronic components. The rear cover 130 is coupled to the rear housing 120 and separable from the rear housing 120. The rear cover 130 may have a plurality of snap-fits 131 disposed at an edge thereof, and the rear housing 120 may have coupling grooves 121 defined to correspond to the snap-fits 131.

When the rear cover 130 is coupled with the rear housing 120, the snap-fits 131 of the rear cover 130 are coupled to the coupling grooves 121 of the rear housing 120. Further, when the rear cover 130 is coupled with or separated from the rear housing 120, the rear cover 130 may be deformed to be elastically bent, as illustrated in the drawing. The rear cover 130 also protects a battery 122 received in the front housing 110 and the rear housing 120. The rear cover 130 may have an opening 132 through which the rear camera device 109 is exposed.

According to embodiments of the present invention, a PCB (or a main board) 10 on which fundamental circuits and the plurality of electronic components are mounted is installed in the rear housing 120. Radio frequency (RF) components associated with a wireless signal through the antenna device 30, such as an RF connector, a mobile communication component, a band pass filter and an antenna matching device, are also mounted on a surface of the PCB 10. The PCB 10 may serve to set an execution environment of the electronic device 100, maintain information thereof, allow the electronic device 100 to be stably driven, and control data of all devices to be smoothly input, output and exchanged.

According to embodiments of the present invention, a shield can 20 shielding the plurality of electronic components mounted on the PCB 10 is installed on the PCB 10. The shield can 20 serves to shield the electronic components and also absorb heat generated from the electronic components. The antenna device 30 for wireless communication may be installed on one surface of the shield can 20. The antenna radiator of the antenna device 30 is installed so that at least a part of the antenna radiator enters through an opening 21 defined in the shield can 20.

As described below, at least a part of the antenna radiator entering through the opening 21 may be installed at an inner surface of the shield can 20. Also, at least a part of the antenna radiator entering through the opening 21 includes a feeding pad connected with a feeding portion of the PCB 10. That is, the shield can 20 may be configured to have a feeding point provided at the inner surface thereof. The antenna radiator is configured to have a larger surface area than the shield can 20 or the PCB 10.

Figure 5:
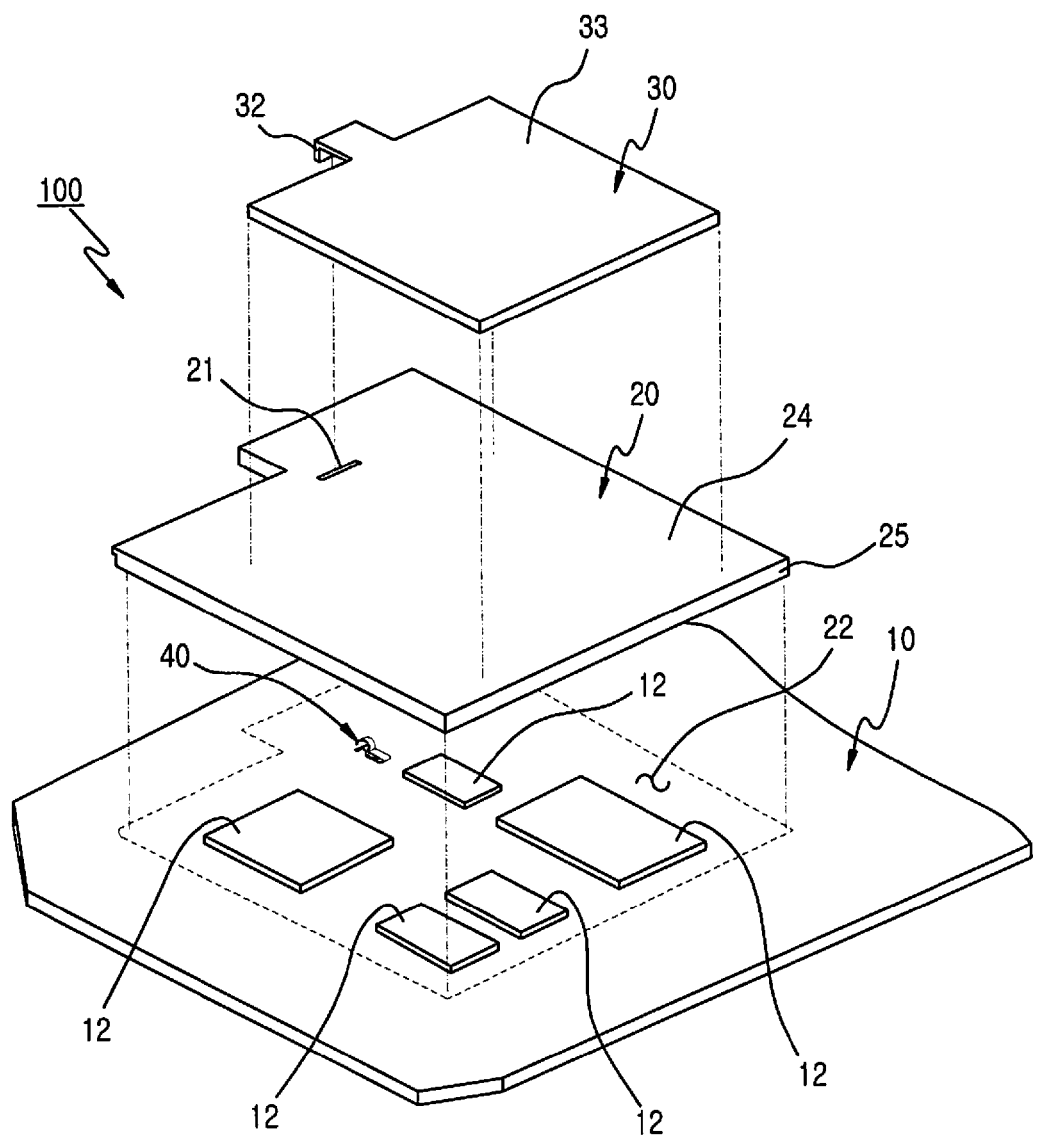
FIG. 5 is an exploded perspective view of a printed circuit board (PCB), a shield can and an antenna device according to an embodiment of the present invention.

FIG. 5 is an exploded perspective view of the PCB 10, the shield can 20 and the antenna device 30 according to an embodiment of the present invention.

Figure 6A:
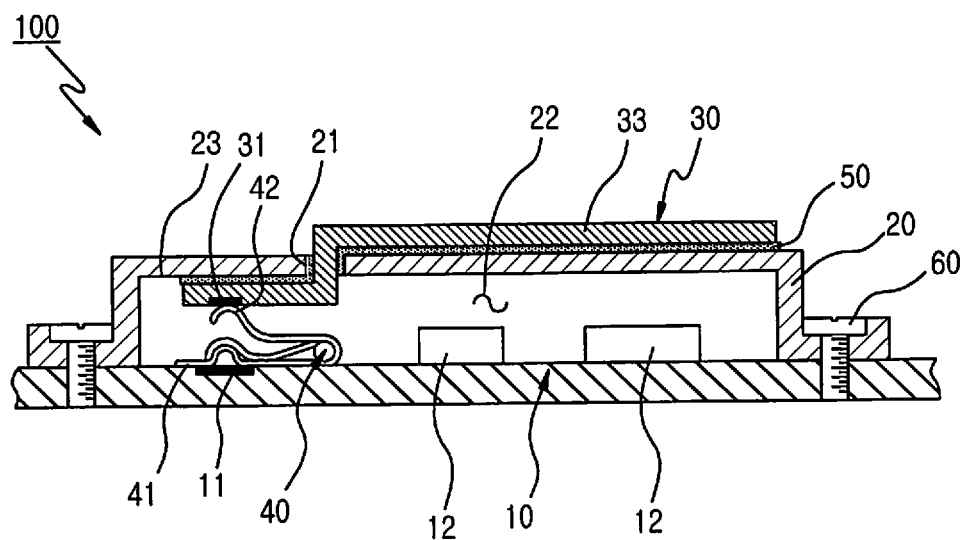
FIGS. 6A to 6D are partial cross-sectional views showing installation states of an antenna device according to an embodiment of the present invention.

Referring to FIG. 5, in the electronic device 100, the shield can 20 is installed on the PCB 10, and the antenna device 30 is installed on the shield can 20. The shield can 20 includes an upper surface 24 having a predetermined surface area, and a plurality of side surfaces 25 having a predetermined height. The side surfaces 25 are installed or defined to enclose an edge of the upper surface 24, and are configured to enclose a lower opened space between a receiving of the PCB 10 and an underside of upper surface 24, as seen in FIG. 6A. When the shield can 20 is installed on the PCB 10, the shield can 20 defines the receiving space 22 for receiving a plurality of components 12 and an electrical connecting means 40 mounted on the PCB. However, the receiving space 22 is not limited thereto, and may further receive various additional devices which provide well-known additional functions. When the shield can 20 is installed on the PCB 10, the shield can 20 is fixed so as to shield the plurality of components 12 and the electrical connecting means 40 mounted on the PCB. The shield can 20 may be made of a conductive metallic material such as SUS and aluminum. In this case, the upper surface 24 and the side surfaces 25 may be integrally formed by pressing, an injection molding process, or the like.

The antenna device 30 is installed on the shield can 20. The antenna device 30 may be a loop antenna device in which a pattern type antenna radiator 33 is wound multiple times along an edge of a flexible printed circuit, but is not limited thereto. For example, the antenna device 30 may be a plate type embedded antenna device, such as a dipole antenna device, a monopole antenna device, a helical antenna device, a micro-strip patch antenna device and a planar inverted F antenna device.

At least a part 32 of the antenna radiator 33 enters through an opening 21 defined in the shield can 20, and is installed at the inner surface of the shield can 20. The part 32 of the antenna radiator 33 entering through the opening 21 of the shield can 20 includes a feeding pad 31 connected with a feeding portion of the PCB 10, as shown in FIG. 6A. The feeding pad 31 of the antenna radiator 33 is connected with the feeding portion of the PCB 10 through the electrical connecting means 40. The electrical connecting means 40 may be a C-clip 40 as illustrated in the drawing and formed of various conductive materials such as a well-known conductive tape having a predetermined thickness. A fixing end located at one end of the C-clip 40 is electrically connected with the feeding portion of the PCB 10, and a free end located at the other end thereof is in contact with the feeding pad 31 of the antenna radiator 33.

Therefore, the C-clip 40 is disposed between the feeding pad 31 of the antenna radiator 33 and the feeding portion of the PCB 10 so as to promote good electrical connection therebetween. The C-clip 40 is mounted on the PCB 10, and the free end of the C-clip 40 is in contact with the feeding pad 31 of the antenna radiator 33 during the assembly process. Due to this configuration, the antenna device 30 receives a current from the feeding portion, and resonate by magnetic induction coupling, and thus may transmit and receive a wireless signal at a corresponding frequency range. The antenna device 30 may be used for short range communication such as NFC communication and RFID communication.

FIGS. 6A to 6D are partial cross-sectional views showing installation states of the antenna device 30 according to an embodiment of the present invention.

Referring to FIG. 6A, the shield can 20 serves as a noise blocker for preventing internal noise generated from the PCB 10 from being leaked to an outside and preventing external noise from being introduced therein. The shield can 20 is installed on the PCB 10 of the electronic device 100. The shield can 20 defines the receiving space 22 receiving the plurality of electronic components 12 and the electrical connecting means 40 mounted on the PCB, and is fastened to the PCB 10, for example, by a screw 60. The antenna device 30 is installed on the shield can 20, and the at least a part 32 of the antenna radiator 33 enters the receiving space 22 through the opening 21 defined in the shield can 20 and may be attached to the inner surface 23 of the shield can 20. The at least a part 32 of the antenna radiator 33 entering through the opening 21 of the shield can 20 includes the feeding pad 31 electrically connected with a feeding portion 11 of the PCB 10. The feeding pad 31 may be electrically connected to the feeding portion 11 through the electrical connecting means 40.

A ferrite film 50 may be disposed between the shield can 20 and the antenna radiator 33, which serves to minimize an influence of the shield can 20 made of a metallic material on radiation performance of the antenna radiator 33. The ferrite film 50 may be stacked together with the antenna radiator 33, or may be attached to the shield can 20 through an adhering means such as an adhesive and a tape.

A manufacturing method of the antenna radiator 33 used in the antenna device 30 includes an SUS welding method in which a metal piece having a desired pattern is prepared by a stamp forming process and then thermal-welded to a body, an etching method which plates whole parts of an object with a metal and then removes the plated metal except for a desired pattern, a double injection molding method which plates a molded body only with a pattern, an LDS (Laser Direct Structure) method which carves a conductive circuit in a three-dimensional surface using a laser beam and then plates it, and a PDS (Printing Direct Structure) method in which a molded body is printed with conductive ink and then plated.

The antenna device 30 includes the antenna radiator 33 having a predetermined pattern, and a lower portion of the antenna device 30 may be electrically connected with the feeding portion 11 of the PCB 10 through the electrical connecting means 40. The electrical connecting means 40 may be a C-clip 40 as illustrated and various conductive materials such as a well-known conductive tape having a predetermined thickness. The C-clip 40 is fastened to the PCB 10, and include a fixing end 41 connected with the feeding portion 11 and a free end 42 which is extended from the fixing end 41 and then bent to be elastically deformed. The free end 42 of the C-clip 40 is in contact with the feeding pad 31 of the antenna radiator 33.

Therefore, the C-clip 40 is disposed between the feeding pad 31 of the antenna radiator 33 and the feeding portion 11 of the PCB 10 so as to promote a good electrical connection. The C-clip 40 may be mounted on the PCB 10, and may be integrally defined by bending a metal plate. The free end 42 of the C-clip 40 is in smooth contact with the feeding pad 31 of the antenna radiator 33 during assembling. Due to this configuration, the antenna device 30 may receive a current from the feeding portion 11, or may resonate by magnetic induction coupling, and thus transmits and receives a wireless signal at a corresponding frequency range.

Figure 6B:
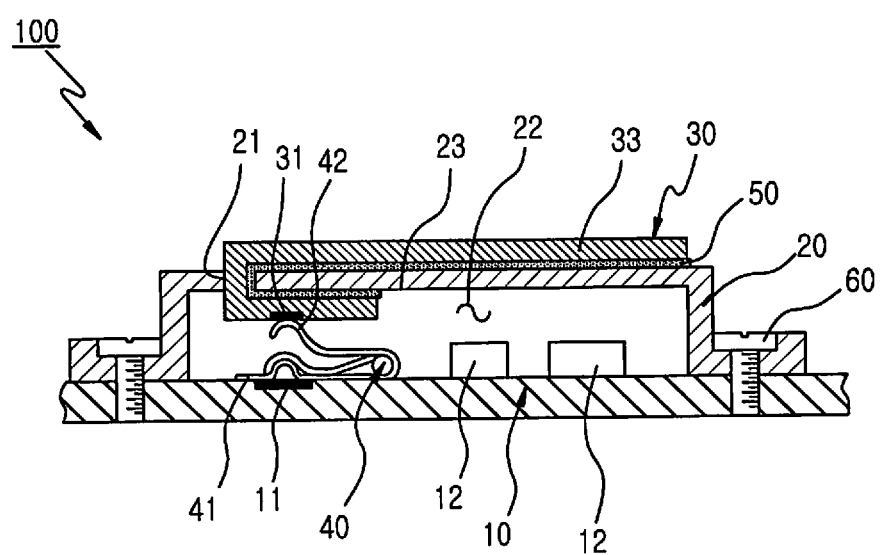

Referring to FIG. 6B, the shield 20 serves as a noise blocker for preventing internal noise generated from the PCB 10 from being leaked to an outside and prevents external noise from being introduced therein. The shield can 20 is installed on the PCB 10 of the electronic device 100. The shield can 20 provides the receiving space 22 receiving the plurality of electronic components 12 and the electrical connecting means 40 mounted on the PCB, and is fastened to the PCB 10 by the screw 60. The antenna device 30 is installed on the shield can 20, and the at least a part 32 of the antenna radiator 33 enters the receiving space 22 through the opening 21 defined in the shield can 20 and is attached to the inner surface 23 of the shield can 20.

Unlike in FIG. 6A, the antenna device 30 in FIG. 6B is installed at the inner surface 23 of the shield can 20 so as to be bend in the form of a '⊂' shape through the opening 21.

The at least a part 32 of the antenna radiator 33 entering through the opening 21 of the shield can 20 includes a feeding pad 31 electrically connected with a feeding portion 11 of the PCB 10. The feeding pad 31 is electrically connected to the feeding portion 11 through the electrical connecting means 40.

The ferrite film 50 is disposed between the shield can 20 and the antenna radiator 33. The ferrite film 50 minimizes an influence of the shield can 20 made of a metallic material on radiation performance of the antenna radiator 33. The ferrite film 50 may be stacked together with the antenna radiator 33, or may be attached to the shield can 20 through an adhering means such as an adhesive and a tape.

Figure 6C:
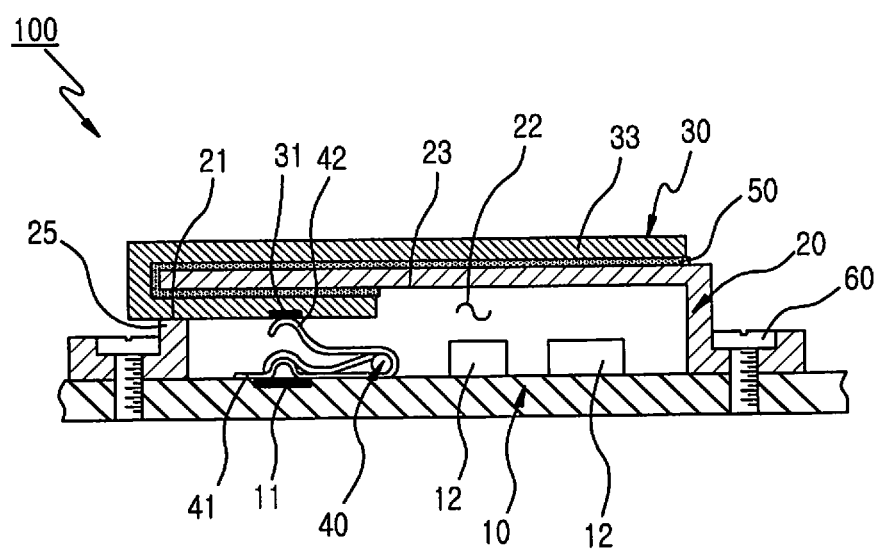

Referring to FIG. 6C, the shield can 20 serves as a noise blocker for preventing internal noise generated from the PCB 10 from being leaked to an outside and prevents external noise from being introduced therein. The shield can 20 is installed on the PCB 10 of the electronic device 100.

The shield can 20 provides the receiving space 22 receiving the plurality of electronic components 12 and the electrical connecting means 40 mounted on the PCB, and is fastened to the PCB 10 by the screw 60. The antenna device 30 is installed on the shield can 20, and the at least a part 32 of the antenna radiator 33 enters the receiving space 22 through the opening 21 defined in the shield can 20 and is attached to the inner surface 23 of the shield can 20.

Unlike in FIGS. 6A and 6B, the opening 21 FIG. 6C is defined in the side surface 25 of the shield can 20. The antenna radiator 33 enters through the opening 21 defined in the side surface 25 of the shield can 25.

The at least a part 32 of the antenna radiator 33 entering through the opening 21 of the shield can 20 includes a feeding pad 31 electrically connected with a feeding portion 11 of the PCB 10. The feeding pad 31 is electrically connected to the feeding portion 11 through the electrical connecting means 40.

The ferrite film 50 may be disposed between the shield can 20 and the antenna radiator 33. The ferrite film 50 minimizes an influence of the shield can 20 made of a metallic material on radiation performance of the antenna radiator 33. The ferrite film 50 may be stacked together with the antenna radiator 33, or may be attached to the shield can 20 through an adhering means such as an adhesive and a tape.

The antenna device 30 includes the antenna radiator 33 having a predetermined pattern, and a lower portion of the antenna device 30 is electrically connected with the feeding portion 11 of the PCB 10 through the electrical connecting means 40. The electrical connecting means 40 may be a C-clip 40 which is fastened to the PCB 10, and includes a fixing end 41 connected with the feeding portion 11 and a free end 42 which is extended from the fixing end 41 and then bent to be elastically deformed. The free end 42 of the C-clip 40 is in contact with the feeding pad 31 of the antenna radiator 33.

Therefore, the C-clip 40 is disposed between the feeding pad 31 of the antenna radiator 33 and the feeding portion 11 of the PCB 10 so as to promote a good electrical connection. Due to this configuration, the antenna device 30 may receive a current from the feeding portion 11, and may resonate by magnetic induction coupling, and thus transmits and receives a wireless signal at a corresponding frequency range.

Figure 6D:
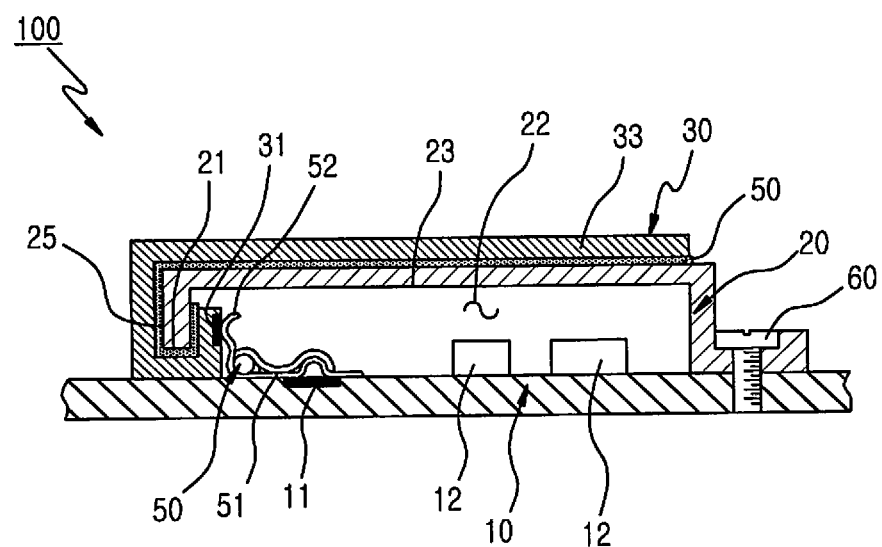

Referring to FIG. 6D, the shield can 20 serves as a noise blocker for preventing internal noise generated from the PCB 10 from being leaked to an outside and prevents external noise from being introduced therein. The shield can 20 is installed on the PCB 10 of the electronic device 100.

The shield can 20 provides the receiving space 22 receiving the plurality of electronic components 12 and the electrical connecting means 40 mounted on the PCB, and is fastened to the PCB 10 by the screw 60. The antenna device 30 is installed on the shield can 20, and the at least a part 32 of the antenna radiator 33 enters the receiving space 22 through the opening 21 defined in the side surface 25 of the shield can 20 and is attached to the inner surface 23 of the shield can 20.

Unlike in FIG. 6C, the antenna radiator 33 in the drawing is installed and disposed along the side surface 25 of the shield can 20 and between the PCB 10 and the side surface 25 of the shield can 20. Further, unlike in FIGS. 6A and 6B, the antenna radiator 33 is installed to be attached to an inner surface of the side surface 25.

The at least a part 32 of the antenna radiator 33 entering through the opening 21 of the shield can 20 includes a feeding pad 31 electrically connected with a feeding portion 11 of the PCB 10. The feeding pad 31 is electrically connected to the feeding portion 11 through the electrical connecting means 40.

The ferrite film 50 may be disposed between the shield can 20 and the antenna radiator 33. The ferrite film 50 minimizes an influence of the shield can 20 made of a metallic material on radiation performance of the antenna radiator 33. The ferrite film 50 may be stacked together with the antenna radiator 33, or may be attached to the shield can 20 through an adhering means such as an adhesive and a tape.

The antenna device 30 includes the antenna radiator 33 having a predetermined pattern, and a lower portion of the antenna device 30 is electrically connected with the feeding portion 11 of the PCB 10 through the electrical connecting means 40. The electrical connecting means 40 is a connection clip 50 modified from the C-clip of FIGS. 6A-6C. In connection clip 50, a fixing end 51 disposed at one end of the connection clip 50 and fastened to the PCB 10 is electrically connected with the feeding portion 11 of the PCB 10, and a free end 52 disposed at the other end thereof and having predetermined elastic force is in contact with the feeding pad 31 of the antenna radiator 33.

Therefore, the connection clip 50 is disposed between the feeding pad 31 of the antenna radiator 33 and the feeding portion 11 of the PCB 10 so as to promote a good electrical connection therebetween. The connection clip 50 is mounted on the PCB 10, and the free end 52 of the connection clip 50 is in smooth contact with the feeding pad 31 of the antenna radiator 33. Due to this configuration, the antenna device 30 may receive a current from the feeding portion, and may resonate by magnetic induction coupling, and thus transmits and receives a wireless signal at a corresponding frequency range.

According to a configuration of the antenna device 30, in the antenna radiator 33, since the shield can 20 is firmly fastened to the PCB 10 so as to be not deformed by the external environment, a contacting defect between the free end 42 of the C-clip 40 and the feeding pad 31 of the antenna radiator 33 may be prevented. Further, since the shield can 20 serves as a reinforcing plate, a metal plate (e.g., a gold pad) is not needed at a contacting point between the free end 42 of the C-clip 40 and the feeding pad 31 of the antenna radiator 33, and thus manufacturing costs may be lowered. Furthermore, since an installation space of the antenna device 30 is minimized, it is possible to increase an available space. The antenna device 30 may be used for short range communication such as NFC communication and RFID communication.

Table 1 below shows performance comparison between the NFC antenna device according to embodiments of the present invention and the conventional NFC antenna device.

Table 1 shows measurement results of a lord modulation as an indicator for verifying performance of the NFC antenna. As shown in Table 1, it is understood that the performance of the NFC antenna device according to the present invention is almost the same as that of the conventional NFC antenna device. Therefore, when the NFC antenna device according to the present invention is applied, it is possible to prevent the contacting defect of the NFC antenna device and reduce the manufacturing costs without performance deterioration.

TABLE 1

| Position | Criteria | Efficiency (%) of conventional NFC antenna | | Efficiency (%) of NFC antenna of the invention | |
| --- | --- | --- | --- | --- | --- |
| | | Type A | Type B | Type A | Type B |
| (0, 0, 0) | 8.8 | 36.1 | 37.3 | 37.0 | 36.9 |
| (0, 1, 0) | 4.9 | 35.4 | 34.6 | 36.2 | 35.0 |
| (0, 1, 3) | 4.9 | 25.7 | 24.5 | 25.5 | 25.2 |
| (0, 1, 6) | 4.9 | 35.1 | 34.2 | 34.8 | 33.9 |
| (0, 1, 9) | 4.9 | 40.2 | 39.9 | 39.7 | 40.6 |
| (1, 0, 0) | 7.2 | 24.7 | 25.9 | 25.1 | 25.5 |
| (1, 1, 0) | 4.1 | 25.3 | 24.5 | 25.7 | 24.3 |
| (1, 1, 3) | 4.1 | 24.5 | 24.3 | 24.6 | 23.9 |

TABLE 1-continued

| Position | Criteria | Efficiency (%) of conventional NFC antenna | | Efficiency (%) of NFC antenna of the invention | |
| --- | --- | --- | --- | --- | --- |
| | | Type A | Type B | Type A | Type B |
| (1, 1, 6) | 4.1 | 24.4 | 24.7 | 25.1 | 24.2 |
| (1, 1, 9) | 4.1 | 26.2 | 27.3 | 25.8 | 27.1 |
| (2, 0, 0) | 5.6 | 23.8 | 24.5 | 24.4 | 25.1 |
| (2, 1, 0) | 3.3 | 25.2 | 24.9 | 24.7 | 24.2 |
| (2, 1, 3) | 3.3 | 23.4 | 23.8 | 24.1 | 23.6 |
| (2, 1, 6) | 3.3 | 26.4 | 25.8 | 25.5 | 25.6 |
| (2, 1, 9) | 3.3 | 24.5 | 26.2 | 25.3 | 26.8 |
| (3, 0, 0) | 4.0 | 24.4 | 23.5 | 24.3 | 23.5 |

According to the above-mentioned embodiments, it is possible to provide the antenna device of the present invention to reduce manufacturing costs and also enhance lifespan and reliability thereof.

While the invention has been shown and described with reference to certain embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. An electronic device comprising:
 a printed circuit board (PCB);
 a shield can disposed on the PCB and made of a conductive metallic material, the shield can serves to shield electronic components of the PCB and absorb heat generated from the electronic components;
 an antenna radiator of which at least a part enters an internal space of the shield can and is installed at an inner surface of the shield can; and
 an electrical connecting means which is installed at a corresponding position of the PCB so as to be electrically connected with the at least a part of the antenna radiator installed at the inner surface of the shield can,
 wherein a ferrite film is disposed between the antenna radiator and the shield can, and
 wherein the antenna radiator is stacked with the ferrite film.

2. The device of claim 1, wherein the shield can is fastened to the PCB.

3. The device of claim 1, wherein the antenna radiator is defined as a flexible printed circuit in which a conductive pattern is disposed in a loop shape.

4. The device of claim 1, wherein the antenna radiator is used for short range communication.

5. The device of claim 4, wherein the antenna radiator is used for one of RFID communication and NFC communication.

6. The device of claim 1, wherein the shield can comprises:
 an upper surface having a predetermined size;
 a side surface which is bent along an edge of the upper surface to have a predetermined height; and
 an opening defined in the shield can,
 wherein the at least a part of the antenna radiator enters an internal space of the shield through the opening.

7. The device of claim 6, wherein the at least a part of the antenna radiator is bent through the opening.

8. The device of claim 7, wherein the opening is defined in the upper surface, and the at least a part of the antenna radiator is installed at an inner surface opposite to the upper surface.

9. The device of claim 7, wherein the opening is defined in the side surface, and the at least a part of the antenna radiator is installed at an inner side surface opposite to the side surface.

10. The device of claim 6, wherein the at least a part of the antenna radiator comprises a feeding pad which is electrically connected with a feeding portion of the PCB.

11. The device of claim 10, wherein the electrical connecting means electrically connects the feeding portion and the feeding pad.

12. The device of claim 11, wherein the electrical connecting means is integrally formed by bending a metal plate.

13. The device of claim 11, wherein the electrical connecting means is one of a C-clip and a conductive tape of which one end is connected with the feeding portion, and the other end is connected with the feeding pad.

14. The device of claim 13, wherein the C-clip comprises,
 a fixing end which is fastened to the PCB and connected with the feeding portion; and
 a free end which extends from the fixing end and then bent to be elastically deformed.

15. A shield can comprising:
 an upper surface;
 an inner surface which is opposite to the upper surface;
 an opening which is defined in at least a portion of the upper surface to pass through to the inner surface; and
 an antenna radiator of which at least a part is installed at the upper surface,
 wherein a feeding portion of the antenna radiator is installed at the inner surface through the opening, and
 the shied can is made of a conductive metallic material, the shield can serves to shield electronic components and absorb heat generated from the electronic components,
 wherein a ferrite film is disposed between the upper surface and the antenna radiator, and
 wherein the antenna radiator is stacked with the ferrite film.

16. The shield can of claim 15, wherein the antenna radiator is used for one of RFID communication and NFC communication.

* * * * *